(12) United States Patent
Ishida

(10) Patent No.: US 7,411,456 B2
(45) Date of Patent: Aug. 12, 2008

(54) AGC CIRCUIT

(75) Inventor: Takuma Ishida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 132 days.

(21) Appl. No.: 11/200,130

(22) Filed: Aug. 10, 2005

(65) Prior Publication Data
US 2006/0044065 A1    Mar. 2, 2006

(30) Foreign Application Priority Data
Aug. 24, 2004 (JP) .............................. 2004-244249

(51) Int. Cl.
*H03G 3/10* (2006.01)
(52) U.S. Cl. ................... 330/279; 330/129; 330/278
(58) Field of Classification Search ................. 330/129, 330/279, 278
See application file for complete search history.

(56) References Cited

U.S. PATENT DOCUMENTS

| 4,910,797 | A | | 3/1990 | Min et al. |
|---|---|---|---|---|
| 5,150,075 | A | * | 9/1992 | Hietala et al. ............... 330/279 |
| 5,504,457 | A | * | 4/1996 | Jensen ......................... 330/129 |
| 5,566,363 | A | | 10/1996 | Senda |
| 5,606,284 | A | | 2/1997 | Tamesue et al. |
| 5,752,171 | A | | 5/1998 | Akiya |
| 6,038,432 | A | | 3/2000 | Onoda |
| 6,057,732 | A | | 5/2000 | Morishita |
| 6,977,550 | B2 | | 12/2005 | Ishida et al. |
| 2004/0178851 | A1 | | 9/2004 | Ishida et al. |
| 2005/0030099 | A1 | | 2/2005 | Ishida et al. |

FOREIGN PATENT DOCUMENTS

| JP | 60-123115 | 7/1985 |
|---|---|---|
| JP | 61-133713 | 6/1986 |
| JP | 63-77205 | 4/1988 |
| JP | 63-228808 | 9/1988 |
| JP | 4-355517 | 12/1992 |
| JP | 5-63481 | 3/1993 |

(Continued)

OTHER PUBLICATIONS

Japanese Office Action issued in corresponding Japanese Patent Application No. JP 2003-064980, dated Oct. 17, 2006.

(Continued)

*Primary Examiner*—Robert Pascal
*Assistant Examiner*—Hieu P Nguyen
(74) *Attorney, Agent, or Firm*—McDermott Will & Emery LLP

(57) ABSTRACT

An AGC circuit includes: a variable gain amplifier circuit having a gain controlled with a gain control signal; a rectifier circuit for rectifying an output signal of the variable gain amplifier circuit; a voltage comparator for comparing a rectified signal with a threshold voltage; an up/down counter that switches between up-counting and down-counting according to the level of an output voltage of the voltage comparator; and a D/A converter circuit for outputting a voltage corresponding to a count value of the up/down counter. The gain control signal supplied to the variable gain amplifier circuit corresponds to the voltage output from the D/A converter circuit, and the threshold voltage for the voltage comparator is a voltage corresponding to the voltage output from the D/A converter circuit.

3 Claims, 12 Drawing Sheets

FOREIGN PATENT DOCUMENTS

| | | |
|---|---|---|
| JP | 7-202600 | 8/1995 |
| JP | 8-8768 | 1/1996 |
| JP | 2000-138549 | 5/2000 |
| JP | 2000-216653 | 8/2000 |
| JP | 2003-152483 | 5/2003 |

OTHER PUBLICATIONS

Japanese Office Action issued in corresponding Japanese Patent Application No. JP 2003-287926, dated Oct. 17, 2006.

Japanese Office Action issued in Japanese Patent Application No. JP 2004-244249, mailed Feb. 19, 2008, and translation.

* cited by examiner

AGC CIRCUIT

BACKGROUND OF THE INVENTION

The present invention relates to an automatic gain control (AGC) circuit for controlling the gain of a variable gain amplifier circuit according to the amplitude of an input signal in a communication system or an audio system.

As a conventional AGC circuit, a configuration having an integrator circuit using a capacitor is known. Specifically, such a conventional AGC circuit includes: a variable gain amplifier circuit for amplifying or attenuating an input signal according to the gain controlled with a gain control voltage and outputting the resultant signal; a rectifier circuit for rectifying the output voltage of the variable gain amplifier circuit; an integrator circuit for integrating a voltage rectified by the rectifier circuit into a DC voltage; and a DC amplifier circuit for outputting a voltage proportional to the difference between the DC voltage received from the integrator circuit and a reference voltage as the gain control voltage for the variable gain amplifier circuit. The integrator circuit is essentially composed of a resistor and a capacitor (see U.S. Pat. No. 5,606,284).

In the conventional AGC circuit described above, the signal rectified by the rectifier circuit must be integrated to convert the output signal of the variable gain amplifier circuit to a DC voltage. To accomplish this, the time constant for the integration, determined by the resistance value and the capacitance value of the integrator circuit, must be sufficiently large with respect to the minimum signal period of the analog signal as the input signal of the variable gain amplifier circuit. As a result, the capacitor of the integrator circuit will become too large in capacitance value to be incorporated in an integrated circuit. For example, to secure about 1 ms and about 1 s respectively for the attack time and the recovery time that represent the response time of the AGC circuit, a capacitor having a capacitance value of 0.47 μF is necessary. Such a capacitor can only be provided as an external capacitor.

SUMMARY OF THE INVENTION

An object of the present invention is providing an AGC circuit that does not require an integrator circuit using a capacitor and can be easily incorporated in an integrated circuit.

The AGC circuit of the present invention includes: a variable gain amplifier circuit having a gain controlled with a gain control signal; a rectifier circuit for rectifying an output signal of the variable gain amplifier circuit; a voltage comparator for comparing a rectified signal from the rectifier circuit with a threshold voltage; an up/down counter that switches between up-counting and down-counting according to an output voltage of the voltage comparator; and a D/A converter circuit for outputting a voltage corresponding to a count value of the up/down counter. The gain control signal and the threshold voltage is correspond to the voltage output from the D/A converter circuit.

According to the configuration described above, the signal obtained by rectifying the output signal of the variable gain amplifier circuit is compared with a threshold voltage. Based on the comparison result, the up/down counter switches its operation between up-counting and down-counting, and a gain control signal corresponding to the count value of the up/down counter is fed back to the variable gain amplifier circuit. In this manner, the amplitude of the output signal of the variable gain amplifier circuit is stabilized irrespective of a variation in the amplitude of the input signal of the variable gain amplifier circuit. In this operation, the up-counting and down-counting of the up/down counter acts like charging/discharging of a capacitor. It is therefore unnecessary to provide a capacitor-using integrator circuit, and the resultant AGC circuit can be easily incorporated in an integrated circuit. In addition, the AGC circuit of the present invention can easily adjust the attack time and the recovery time.

If the threshold voltage for the voltage comparator is a fixed value, the amplitude level of the output signal is invariable irrespective of a variation in the amplitude level of the input signal. In use for audio signal processing, for example, the resultantly output audio signal will lack in depth and perspective in audibility.

According to the present invention, the threshold voltage for the voltage comparator is not fixed to a given value in advance, but a voltage corresponding to the output voltage of the D/A converter circuit that changes with the amplitude of the input signal of the variable gain amplifier circuit is supplied as the threshold voltage for the voltage comparator.

DESCRIPTION OF THE PREFERRED EMBODIMENTS

Hereinafter, preferred embodiments of the present invention will be described with reference to the accompanying drawings.

Figure 1:
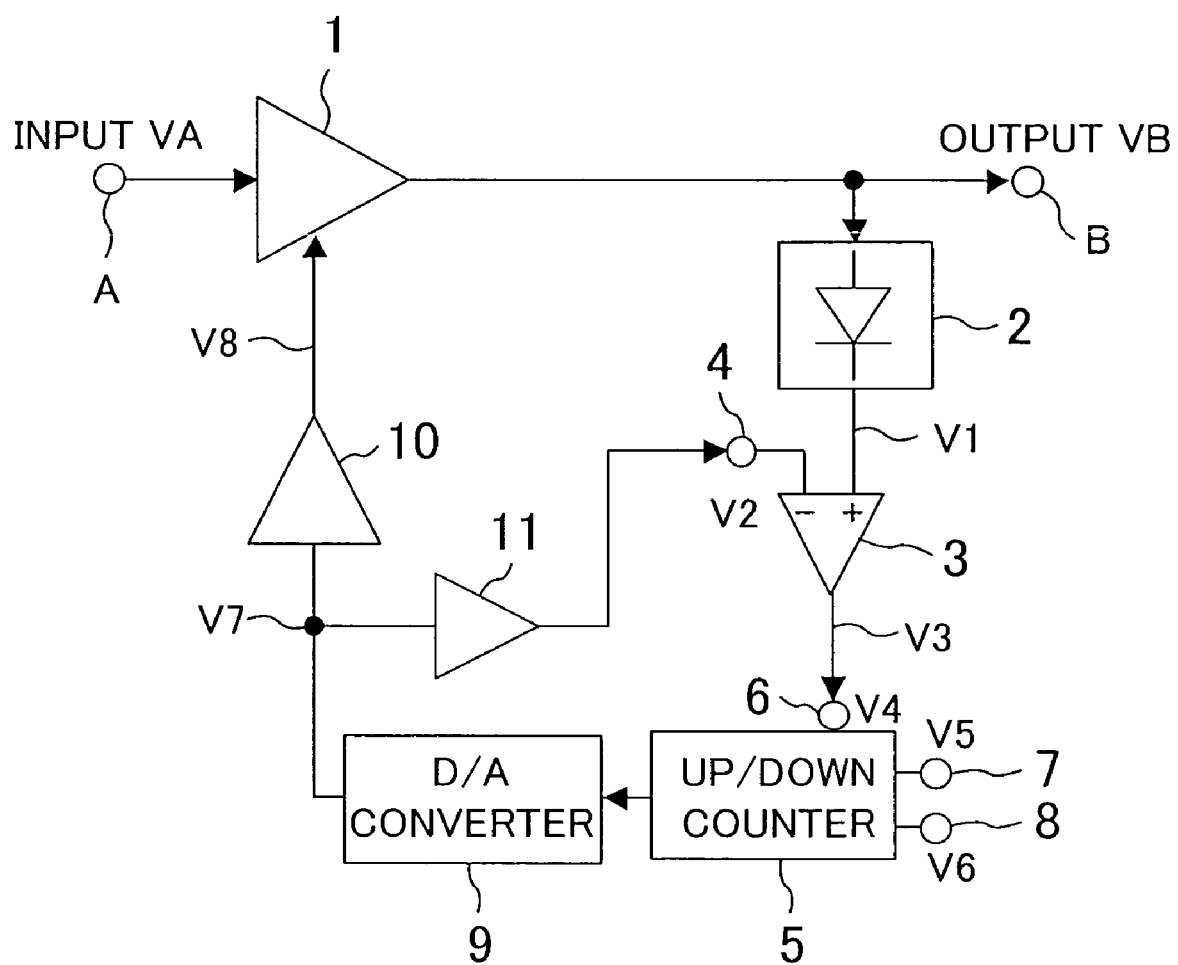
FIG. 1 is a block diagram of an AGC circuit of Embodiment 1 of the present invention.

FIG. 1 shows a configuration of an AGC circuit of Embodiment 1 of the present invention. Referring to FIG. 1, the AGC circuit includes a variable gain amplifier circuit 1, a rectifier circuit 2, a voltage comparator 3, an up/down counter 5, a D/A converter circuit 9, a first DC amplifier circuit 10 and a second DC amplifier circuit 11. The variable gain amplifier circuit 1 amplifies or attenuates an input signal VA received via a signal input terminal A according to the gain controlled with a gain control voltage V8 and outputs an output signal VB via an output terminal B. The rectifier circuit 2 rectifies the output voltage of the variable gain amplifier circuit 1. Hereinafter, the rectifier circuit 2 will be described as being a full-wave rectifier circuit. Alternatively, the rectifier circuit 2 may be a half-wave rectifier circuit. The voltage comparator circuit 3 compares a rectified signal (output signal) V1 of the rectifier circuit 2 with a threshold voltage V2, and outputs a voltage V3 that is in a high level if the output signal V1 is higher than the threshold voltage V2 and in a low level if the output signal V1 is lower than the threshold voltage V2. The threshold voltage V2 is input into the voltage comparator 3 via a threshold voltage input terminal 4. The up/down counter 5 has an up/down counting control input terminal 6 for receiving the output voltage V3 of the voltage comparator 3 as a control signal V4 to control the counting of the up/down counter 5, an input terminal 7 for receiving a clock V5 for up-counting (up-count clock V5), and an input terminal 8 for-receiving a clock V6 for down-counting (down-count clock V6). The up/down counter 5 is configured to perform up-counting based on an up-count frequency set for the up-count clock V5 during the time in which the control signal (voltage) V4 is in a high level. The up/down counter 5 is also configured to perform down-counting based on a down-count frequency set for the down-count clock V6 during the time in which the control signal (voltage) V4 is in a low level. The D/A converter circuit 9 outputs a DC voltage V7 corresponding to the count value of the up/down counter 5. The first DC amplifier circuit 10, which has an arbitrarily set gain, receives the DC voltage V7 output from the D/A converter circuit 9 and outputs the gain control voltage V8. The second DC amplifier circuit 11, which has an arbitrarily set gain, receives the DC voltage V7 and supplies the threshold voltage V2 for the voltage comparator 3.

In the AGC circuit having the configuration shown in FIG. 1, the input signal VA is amplified or attenuated by the variable gain amplifier circuit 1 and output from the output terminal B as the output signal VB. The output signal VB is rectified by the rectifier circuit 2, and output to the voltage comparator 3 as the signal V1. The voltage comparator 3 compares the signal V1 output from the rectifier circuit 2 with the threshold voltage V2, and outputs a high-level voltage if the signal V1 is higher than the threshold voltage V2 and a low-level voltage if the voltage V1 is lower than the threshold voltage V2, as the signal V3. The output voltage V3 of the voltage comparator 3 is then received at the up/down counting control input terminal 6 of the up/down counter 5 as the control signal V4 for up-counting and down-counting of the up/down counter 5.

The up/down counter 5 performs up-counting based on the up-count frequency set for the up-count clock V5 during the period in which the control signal (voltage) V4 is in a high level. The up/down counter 5 also performs down-counting based on the down-count frequency set for the down-count clock V6 during the period in which the control signal (voltage) V4 is in a low level. The D/A converter circuit 9 receives the count value counted by the up/down counter 5 and outputs the DC voltage V7 corresponding to the count value of the up/down counter 5. The DC voltage V7 is changed to a voltage of an arbitrary magnitude by the first DC amplifier circuit 10 to provide the gain control voltage V8 for the variable gain amplifier circuit 1. The gain of the variable gain amplifier circuit 1 changes with the gain control voltage V8 to amplify or attenuate the input signal VA. Assume herein that with increase of the count value of the up/down counter 5, the gain control voltage V8 increases and the gain of the variable gain amplifier circuit 1 decreases, and that with decrease of the count value of the up/down counter 5, the gain control voltage V8 decreases and the gain of the variable gain amplifier circuit 1 increases. The DC voltage V7 is also changed to a voltage of an arbitrary magnitude by the second DC amplifier circuit 11 to provide the threshold voltage V2 for the voltage comparator 3.

The operation described above is repeated until the attenuation and the amplification of the input signal VA with the up-counting and the down-counting, respectively, are balanced with each other, so that the output signal VB is converged to a given constant amplitude level.

The amplitude level of the output signal VB corresponds to the threshold voltage V2 for the voltage comparator 3. In this embodiment, the output voltage V7 of the D/A converter circuit 9 is changed to a voltage of an arbitrary magnitude by the second DC amplifier circuit 11 to be supplied as the threshold voltage V2 for the voltage comparator 3. Since the output voltage V7 of the D/A converter circuit 9 changes with the amplitude level of the input signal VA by the operation described above, the threshold voltage V2 also changes with the amplitude level of the input signal VA. Thus, the amplitude level of the output signal VB is allowed to change with the amplitude level of the input signal VA.

Figure 2A:
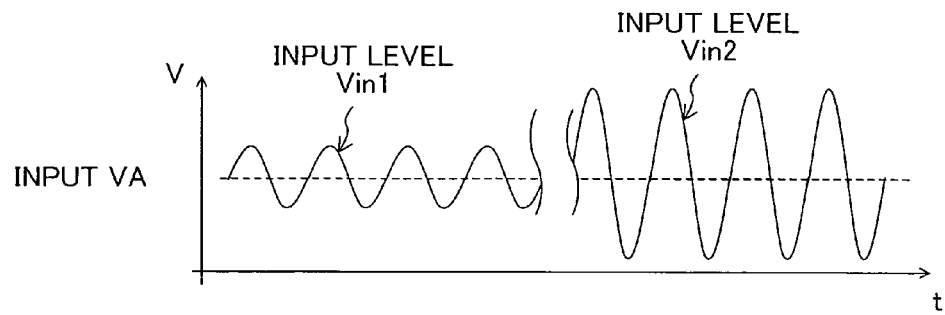
FIGS. 2A to 2D are waveform charts for demonstrating the operation of the AGC circuit of FIG. 1.
Figure 2B:
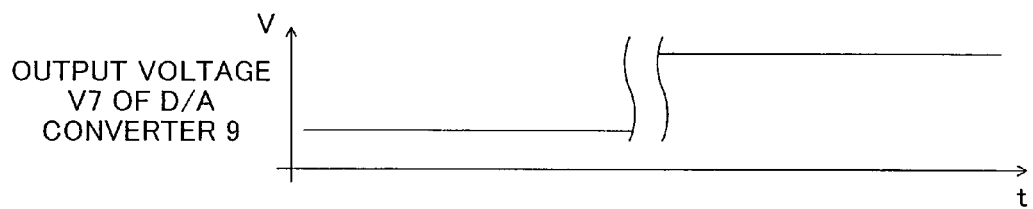
Figure 2C:
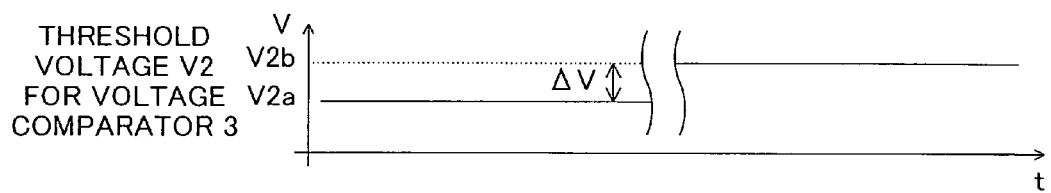
Figure 2D:
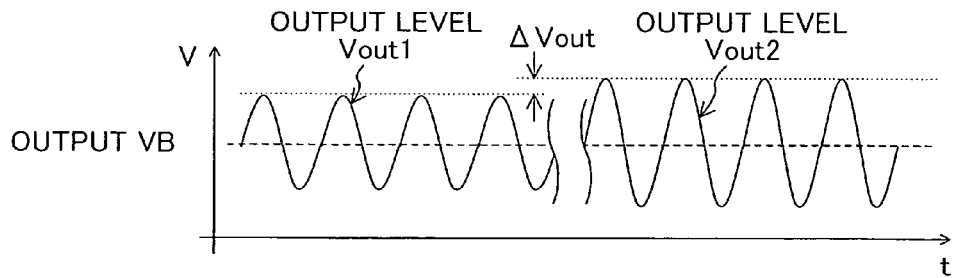

Next, referring to FIGS. 2A to 2D, the effect of the control of the threshold voltage V2 will be described. For example, when a signal of an amplitude level Vin1 and a signal of an amplitude level Vin2 that is greater than Vin1 are input as the input signal VA as shown by the waveform of FIG. 2A, the D/A converter circuit 9 outputs the output voltage V7 as shown by the waveform of FIG. 2B by the operation described above. The output voltage V7 of the D/A converter circuit 9 is changed to a voltage of an arbitrary magnitude by the second DC amplifier circuit 11 to be supplied as the threshold voltage V2 for the voltage comparator 3 as shown by the waveform of FIG. 2C. Specifically, the level of the threshold voltage V2 is V2$a$ for the amplitude level Vin1 of the input signal VA and is V2$b$ for the amplitude level Vin2, producing a variation of ΔV in the threshold voltage V2. As a result, the amplitude level of the output signal VB becomes Vout1 for the amplitude level Vin1 of the input signal VA and becomes Vout2 for the amplitude level Vin2, producing a variation of ΔVout in the output voltage VB.

Figure 3:
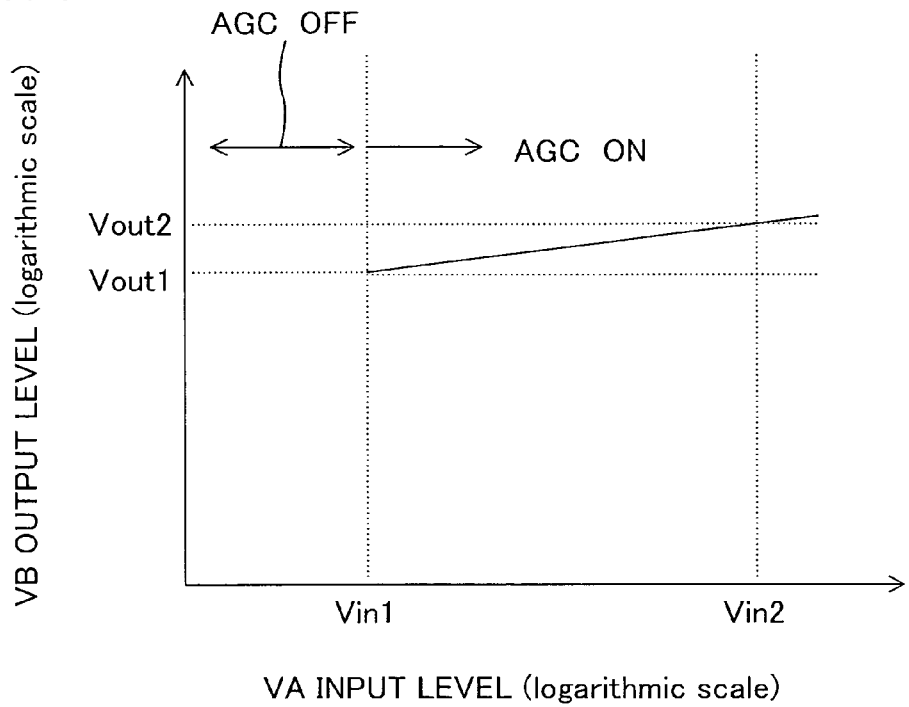
FIG. 3 is a correlation diagram between the input and output signal levels of the AGC circuit of FIG. 1.

FIG. 3 is a correlation diagram between the amplitude level of the input signal VA and the amplitude level of the output signal VB in the AGC circuit of FIG. 1. As shown in FIG. 3, during activation of the AGC function, the amplitude level of the output signal VB changes with the amplitude level of the input signal VA. Hence, in use of the AGC circuit of FIG. 1 for audio signal processing, for example, an audio signal having depth and perspective in audibility can be output.

As described above, by adopting the configuration of FIG. 1, it is possible to provide an AGC circuit that controls the gain of the variable gain amplifier circuit 1 according to the amplitude of the input signal VA without the necessity of an integrator circuit using a capacitor. Such an AGC circuit can be easily incorporated in an integrated circuit. Moreover, during activation of the AGC function, in which the amplitude level of the output signal VB changes with the amplitude level of the input signal VA, the excellent effect can be obtained when the AGC circuit is used for audio signal processing, for example.

In addition, the time required for the output voltage VB to be converged to a constant amplitude level, that is, the attack time and recovery time can be easily adjusted by arbitrarily setting the value of the threshold voltage V2 for the voltage comparator 3, the frequencies of the up-count clock V5 and the down-count clock V6, and the magnitude of change of the gain control voltage V8 corresponding to the count value of the up/down counter 5. Since the up-count and down-count clocks V5 and V6 are input into the up/down counter 5 individually, the attack time and the recovery time can be adjusted independently. For example, when the up-count frequency is 250 kHz, the attack time will be 1 ms. When the down-count frequency is 250 Hz, the recovery time will be 1 s. A logic circuit may be used to enable selection of the up-count frequency and the down-count frequency.

In the case of use of a half-wave rectifier circuit, in place of the full-wave rectifier circuit, as the rectifier circuit, the former may simply replace the latter basically. To attain the same response property, however, the threshold voltage V2 for the voltage comparator 3 and the clock frequencies for the up/down counter 5 must be adjusted.

Figure 4:
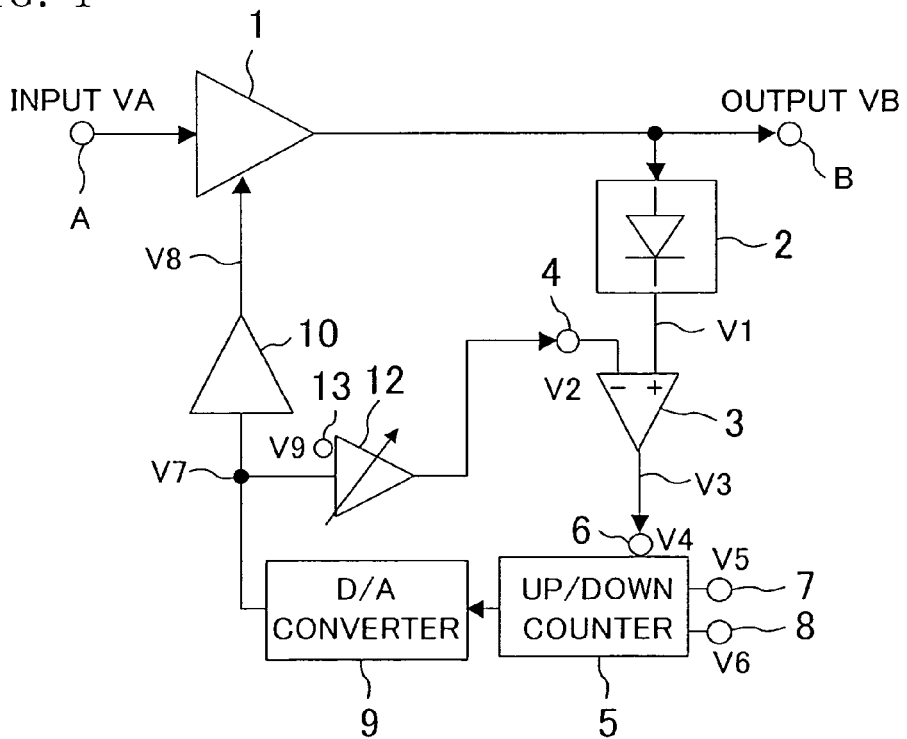
FIG. 4 is a block diagram of an alteration to the AGC circuit of FIG. 1.

FIG. 4 illustrates an alteration to the AGC circuit of FIG. 1. In FIG. 4, the second DC amplifier circuit 11 in FIG. 1 is replaced with a second variable gain amplifier circuit 12. Note that in this alteration the variable gain amplifier circuit 1 receiving the input signal VA described above is called the "first variable gain amplifier circuit". The second variable gain amplifier circuit 12 changes the magnitude of the output voltage V7 of the D/A converter circuit 9 according to its gain controlled with a gain control voltage V9 to output the threshold voltage V2 for the voltage comparator 3. The gain control signal V9 is input into the variable gain amplifier circuit 12 via a gain control input terminal 13.

Figure 5:
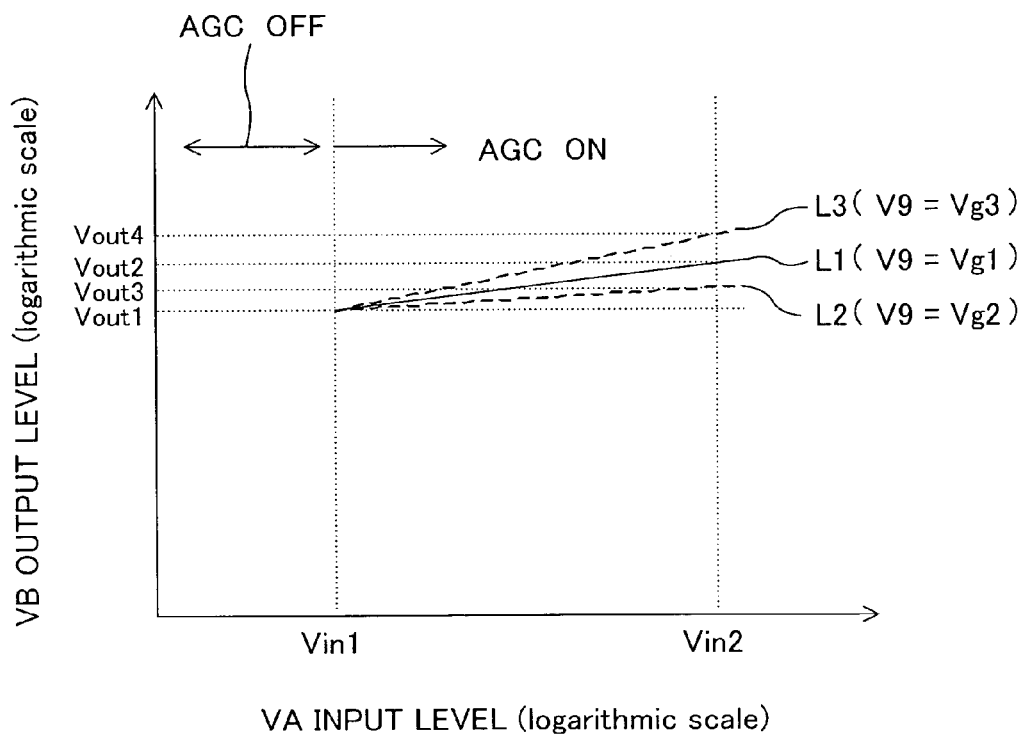
FIG. 5 is a correlation diagram between the input and output signal levels of the AGC circuit of FIG. 4.

FIG. 5 is a correlation diagram between the amplitude level of the input signal VA and the amplitude level of the output signal VB in the AGC circuit of FIG. 4. In the AGC circuit having the configuration of FIG. 4, the degree of contribution of the output voltage V7 of the D/A converter circuit 9 as the supply source of the threshold voltage V2 can be freely set by varying the gain of the second variable gain amplifier circuit 12 with the gain control voltage V9. The correlation between the input signal VA and the output signal VB of the first variable gain amplifier circuit 1, that is, the relationship between the input/output characteristics can be freely set as shown in FIG. 5, for example, in which the relationship of line L1 is given when the voltage V9=Vg1, the relationship of line L2 is given when the voltage V9=Vg2, and the relationship of line L3 is given when the voltage V9=Vg3. Thus, by adopting this configuration, an AGC circuit more excellent than that of FIG. 1 can be provided.

Figure 6:
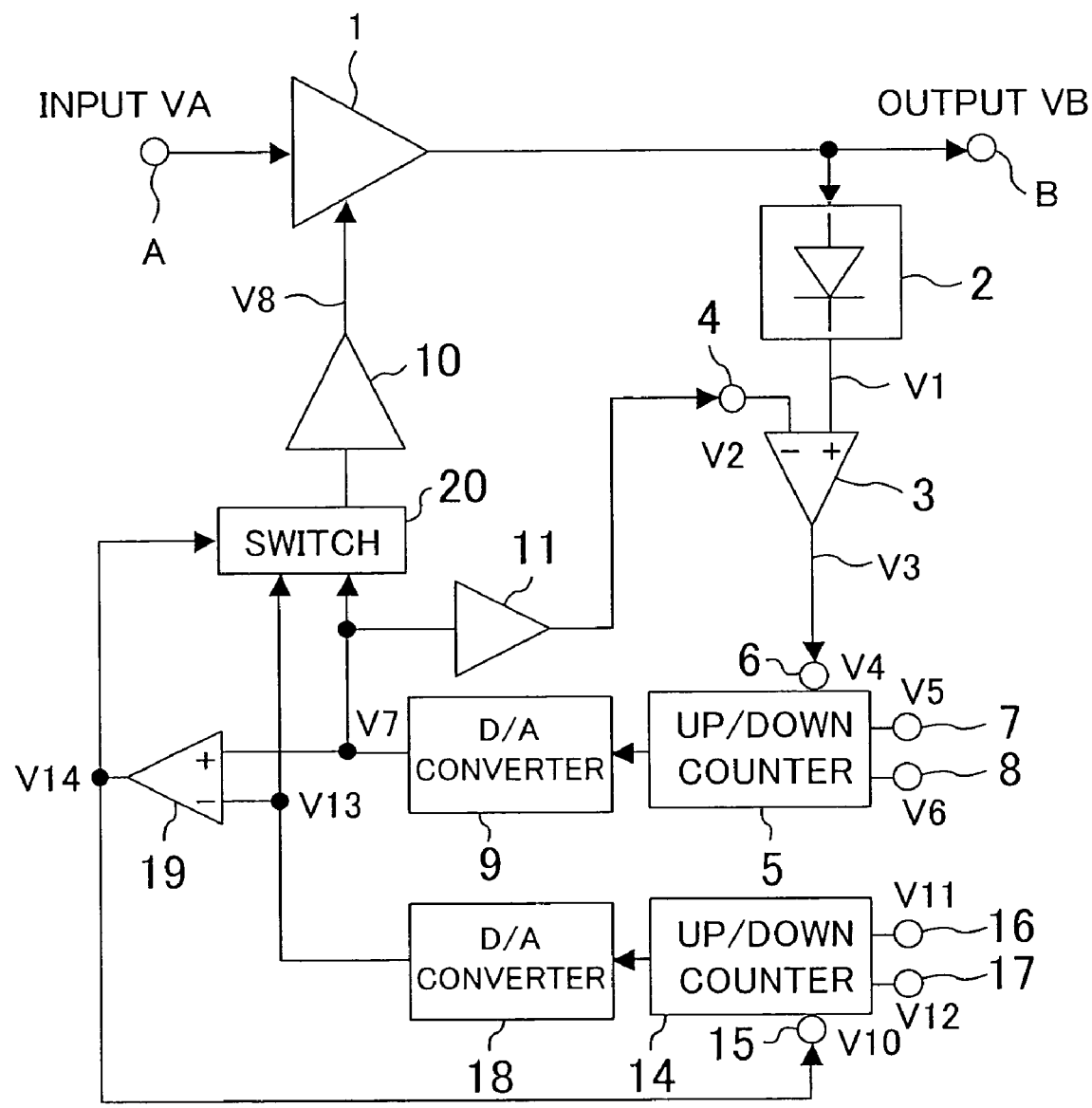
FIG. 6 is a block diagram of an AGC circuit of Embodiment 2 of the present invention.

FIG. 6 shows a configuration of an AGC circuit of Embodiment 2 of the present invention. In FIG. 6, the same components as those of the AGC circuit of FIG. 1 are denoted by the same reference numerals, and description thereof is omitted here. Only the components newly added to the AGC circuit of FIG. 1 will be described hereinafter. Note that in this embodiment, the voltage comparator 3, the up/down counter 5 and the D/A converter circuit 9 described above are respectively called the "first voltage comparator", the "first up/down counter" and the "first D/A converter circuit". Referring to FIG. 6, the AGC circuit further includes a second up/down counter 14, a second D/A converter circuit 18, a second voltage comparator 19 and a switch circuit 20. The second up/down counter 14 has an up/down counting control input terminal 15 for receiving a control signal V10 for control of the direction of counting of the second up/down counter 14, an input terminal 16 for a clock V11 for up-counting (up-count clock V11) for inputting the up-count clock V11 into the second up/down counter 14, and an input terminal 17 for a clock V12 for down-counting (down-count clock V12) for inputting the down-count clock V12 into the second up/down counter 14. The second D/A converter circuit 18 outputs a DC voltage V13 corresponding to the count value of the second up/down counter 14. The second voltage comparator 19 compares the output voltage V7 of the first D/A converter circuit 9 with the output voltage V13 of the second D/A converter circuit 18. The second voltage comparator 19 outputs a voltage V14 of a high level or a low level depending on the result of the comparison between the voltages V7 and V13 for control of the up/down counting of the second up/down counter 14. The switch circuit 20 provides either the output voltage V7 of the first D/A converter circuit 9 or the output voltage V13 of the second D/A converter circuit 18, whichever is higher, to the first DC amplifier circuit 10. Thus, the first DC amplifier circuit 10 amplifies either the voltage V7 or V13 whichever is higher and outputs the amplified voltage as the gain control voltage V8.

In FIG. 6, the series of operation done by the components up to the second DC amplifier circuit 11 is substantially the same as that described with reference to FIG. 1. The second up/down counter 14 performs up-counting based on an up-count frequency set for the up-count clock V11 during the period in which the control signal (voltage) V10 input at the up/down counting control input terminal 15, that is, the output voltage V14 of the second voltage comparator 19 is in a high level. The second up/down counter 14 also performs down-counting based on a down-count frequency set for the down-count clock V12 during the period in which the output voltage V14 of the second voltage comparator 19 is in a low level. The count value counted by the second up/down counter 14 is input into the second D/A converter circuit 18, and the second D/A converter circuit 18 outputs the DC voltage V13 corresponding to the count value received from the second up/down counter 14.

Either the DC voltage V7 or V13, whichever is higher, is provided to the first DC amplifier circuit 10 via the switch circuit 20, and changed to a voltage of an arbitrary magnitude by the first DC amplifier circuit 10 to be used as the gain control voltage V8 for the variable gain amplifier circuit 1.

The DC voltages V7 and V13 are also compared with each other by the second voltage comparator 19. The second voltage comparator 19 outputs the voltage V14 of a high level if the DC voltage V7 output from the first D/A converter circuit 9 is higher than the DC voltage V13 output from the second D/A converter circuit 18, and otherwise outputs the voltage V14 of a low level. The output voltage V14 serves as the control signal V10 for controlling the up/down counting of the second up/down counter 14 and also as the control signal for the switch circuit 20. An example of the simplest configuration of the switch circuit 20 is composed of transfer gates in which a gate for the output voltage V7 is open if the output of the second voltage comparator 19 is high and a gate for the output voltage V13 is open if the output of the second voltage comparator 19 is low, to allow passage of the relevant voltage.

The gain of the variable gain amplifier circuit 1 is changed with the gain control voltage V8, to amplify or attenuate the input signal VA. The operation described above is repeated until the amplification and the attenuation of the input signal VA are balanced with each other with the output of the first or second up/down counter 5 or 14, so that the output signal VB is converged to a given constant amplitude level.

Assuming that the AGC circuit is used for audio signal processing, the AGC circuit of FIG. 1 has the following problems. When the input signal VA becomes smaller in amplitude from the state in which the output signal (voltage) VB is stable at a given constant amplitude level, the output signal VB also becomes smaller in amplitude. In this relation, if the frequency of the down-count clock V6 is high, the time required for the output signal VB to resume the given constant amplitude level after the down-counting of the up/down counter 5 to decrease the gain control voltage V8 and thus increase the gain of the variable gain amplifier circuit 1 is shortened following the high frequency of the down-count clock V6. In the context of actual sound, in the case that sound F smaller in amplitude than previous sound E having a given amplitude is input, the sound will momentarily resume the previous sound, resulting in a strange audio signal lacking in presence and perspective (first problem).

If the frequency of the down-count clock V6 is made low to avoid the problem described above, another problem arises in the case that large sound G changing steeply in a short time such as explosive sound is input when sound E having a given amplitude is being output stably with a constant amplitude with the AGC circuit. That is, with the steep large sound G, the first up/down counter 5 performs up-counting to attenuate the steep large sound G. Therefore, the sound E input in succession with the sound G is also made small. After passing of the steep large sound G, the first up/down counter 5 performs down-counting attempting to resume the sound E having the amplitude kept constant before the input of the steep large sound G. However, since the frequency of the down-count clock V6 is set low, it takes a long time to resume the given constant amplitude level, and as a result, the time during which the sound E is not heard or difficult to be heard will become long (second problem).

According to the AGC circuit of FIG. 6, by setting the frequencies of the up-count clock V11 and the down-count clock V12 of the second up/down counter 14 to be lower than the frequencies of the up-count clock V5 and the down-count clock V6 of the first up/down counter 5, respectively, for example, the circuit operates as follows in the case that sound F smaller than previous sound E having a given amplitude is input. That is, since the sound E is being output with a given constant amplitude with the AGC circuit before the small sound F is input, the output voltage V7 of the first D/A converter circuit 9 and the output voltage V13 of the second D/A converter circuit 18 are roughly balanced with each other at roughly the same potential. When the small sound F is input, the first up/down counter 5 performs down-counting to decrease the output voltage V7. Once the output voltage V7 of the first D/A converter circuit 9 becomes lower than the output voltage V13 of the second D/A converter circuit 18, the output voltage V14 of the second voltage comparator 19 changes its level from high to low, allowing the second up/down counter 14 to perform down-counting to decrease the output voltage V13 of the second D/A converter circuit 18. In this down-counting, since the frequency of the down-count clock V12 for the second up/down counter 14 is lower than the frequency of the down-count clock V6 for the first up/down counter 5, the rate of decrease of the output voltage V13 of the second D/A converter circuit 18 is slow. Accordingly, the state that the output voltage V13 of the second D/A converter circuit 18 is higher than the output voltage V7 of the first D/A converter circuit 9 is kept, and thus the gain control voltage V8 is produced from the output voltage V13 of the second D/A converter circuit 18 selected by the switch circuit 20. As a result, the time required for the sound F to resume its constant amplitude with the AGC circuit is prolonged, enabling output of an agreeable audio signal free from lacking in presence and perspective.

The relationship between the frequencies of the up-count and down-count clocks V11 and V12 for the second up/down counter 14 and the frequencies of the up-count and down-count clocks V5 and V6 for the first up/down counter 5 may be reverse to that described above.

In the case that large sound G changing steeply in a short time such as explosive sound is input when sound E having a given amplitude is being input stably with a constant amplitude with the AGC circuit, the AGC circuit of this embodiment operates as follows. That is, with the steep large sound G, the first up/down counter 5 performs up-counting to increase the output voltage V7 of the first D/A converter circuit 9. Under the control with the output voltage V14 of the second voltage comparator 19, the second up/down counter 14 also performs up-counting to increase the output voltage V13 of the second D/A converter circuit 18. In this up-counting, since the frequency of the up-count clock V5 for the first up/down counter 5 is higher than the frequency of the up-count clock V11 for the second up/down counter 14, the output voltage V7 of the first D/A converter circuit 9 becomes high faster than the output voltage V13 of the second D/A converter circuit 18, resulting in that the gain of the variable gain amplifier circuit 1 follows the gain control voltage V8 that is produced from the output voltage V7 of the first D/A converter circuit 9. After passing of the steep large sound G, it is attempted to resume the sound E having the amplitude kept constant before the input of the sound G. In this operation, the first up/down counter 5 performs down-counting. However, since the output voltage V7 of the first D/A convert circuit 9 is higher than the output voltage V13 of the second D/A converter circuit 18, the second up/down counter 14 continues the up-counting performed in response to the input of the steep large sound G After a while, the relationship between the voltages V7 and V13 is reversed, allowing the second up/down counter 14 to start down-counting.

During the time in which the output voltage V7 of the first D/A convert circuit 9 is higher than the output voltage V13 of the second D/A converter circuit 18, the rate at which the sound E resumes its constant amplitude follows the frequency of the down-count clock V6 for the first up/down counter 5. Thus, the problem described above can be avoided.

As described above, when the configuration of FIG. 6 is used for audio signal processing, and the relationships that frequency of V5>frequency of V11 and frequency of V6>frequency of V12, for example, are set, the attack time follows the frequency of the up-count clock V5 for the first up/down counter 5 while the recovery time follows the frequency of the down-count clock V12 for the second up/down counter 14. If large sound changing abruptly in a short time like explosive sound is input while some sound is being input stably with a constant amplitude, the recovery operation follows the down-count clock V6 for the first up/down counter 5. In this way, an agreeable audio signal free from impairing presence and perspective can be output.

In the above embodiment, to avoid the first and second problems described above, the clocks V5, V6, V11 and V12 for the first and second up/down counter 5 and 14 had different frequencies from one another. Substantially the same effect can also be obtained by allowing the first and second D/A converter circuits 9 and 18 to change the count values by different magnitudes, that is, by setting the magnitude of change for the second D/A converter circuit 18 smaller than that for the first D/A converter circuit 9, for example.

The same clock may be given for both up-counting and down-counting of the first and second up/down counters 5 and 14, instead of giving independent clocks having different periods for up-counting and down-counting. In this case, however, independent adjustment of the attack time and the recovery time is not allowed.

Figure 7:
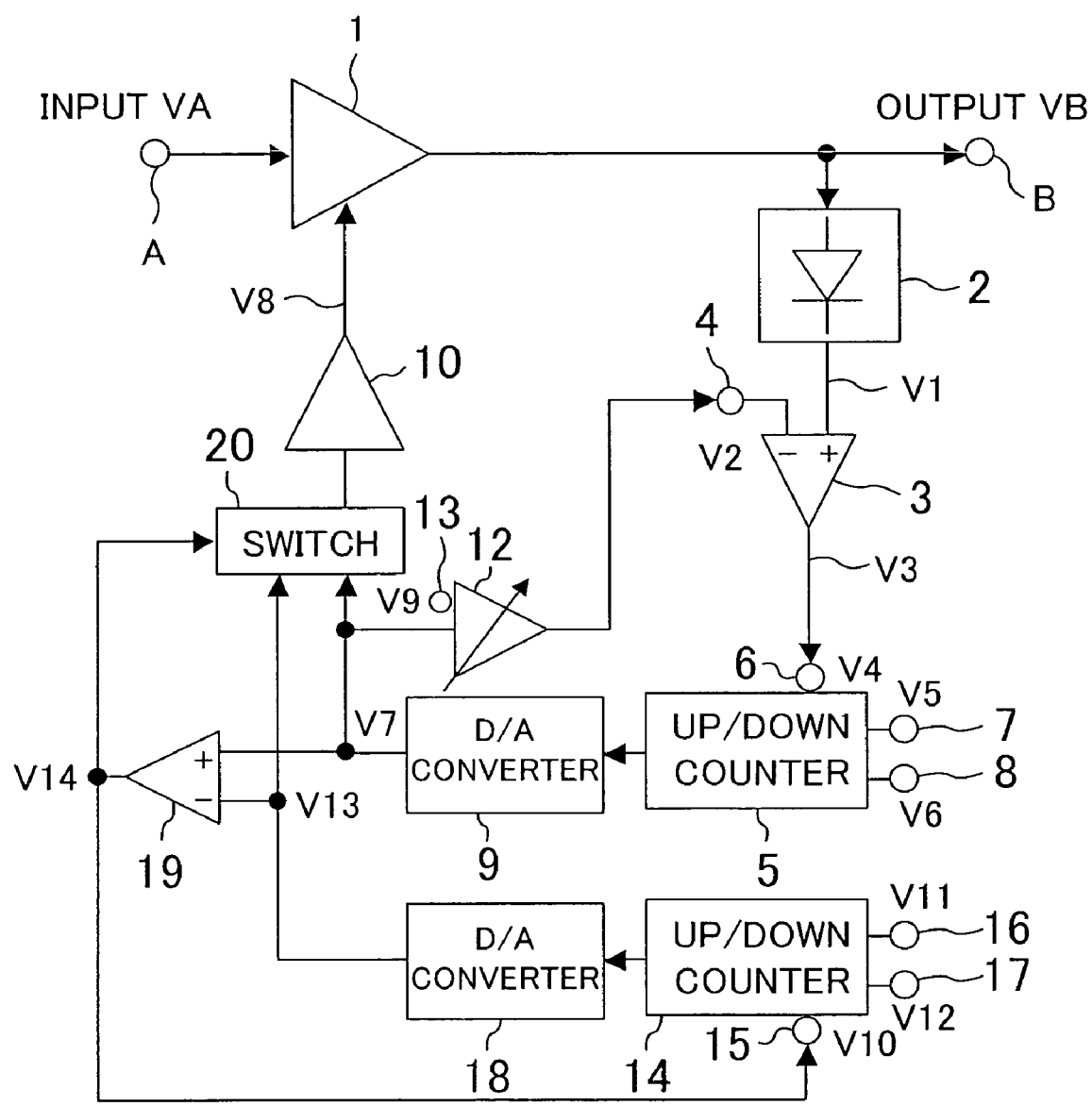
FIG. 7 is a block diagram of an alteration to the AGC circuit of FIG. 6.

FIG. 7 shows an alteration to the AGC circuit of FIG. 6. As in the alteration of FIG. 4 to the configuration of FIG. 1, the second DC amplifier circuit 11 in FIG. 6 is replaced with the variable gain amplifier circuit 12.

Figure 8:
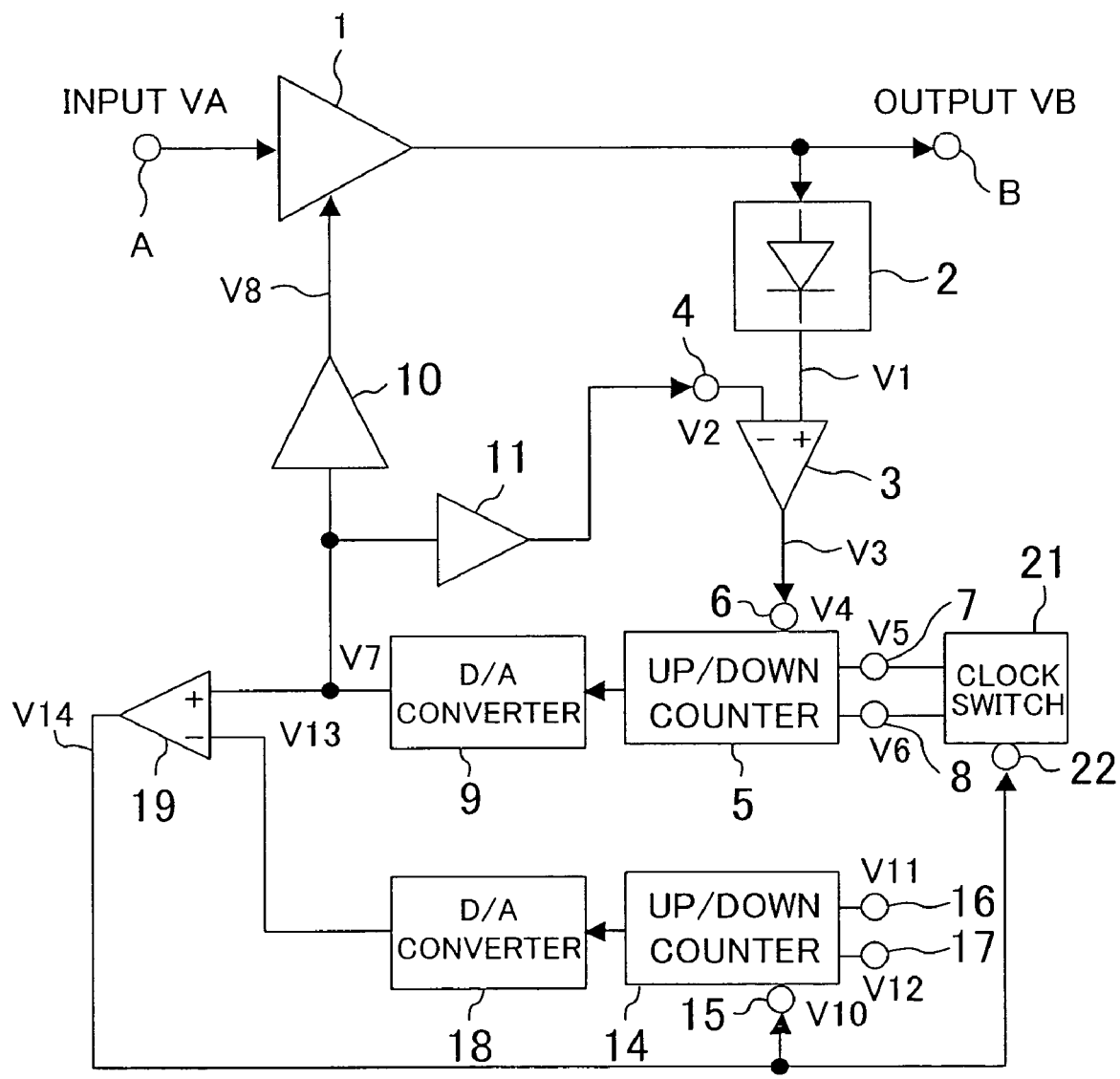
FIG. 8 is a block diagram of an AGC circuit of Embodiment 3 of the present invention.

FIG. 8 shows a configuration of an AGC circuit of Embodiment 3 of the present invention. In FIG. 8, a clock switch circuit 21 is provided in place of the switch circuit 20 in FIG. 6. In FIG. 8, the same components as those of the AGC circuit of FIG. 6 are denoted by the same reference numerals, and description thereof is omitted here. Only the component newly added to the AGC circuit of FIG. 6 will be described hereinafter. The clock switch circuit 21 in FIG. 8 receives the output voltage V14 of the second voltage comparator 19 and switches the frequency of the count clock V5 or V6 for the first up/down counter 5 according to the level of the voltage V14 received via a clock switch control input terminal 22.

The AGC circuit of FIG. 6 described above has the following problem. When the input offset of the second voltage comparator 19 is large, the difference between the output voltage V7 of the first D/A converter circuit 9 and the output voltage V13 of the second D/A converter circuit 18, either of which is transmitted via the switch circuit 20 is also large. This increases the change of the gain control voltage V8 at the switching, causing occurrence of distortion in the waveform of the output signal of the variable gain control circuit 1 and generation of a frequency signal that has not originally been input. In the case of an audio signal, abnormal sound will be generated giving strangeness in audibility. Distortion and abnormal sound will also be generated due to switching noise and the like of the switch circuit 20 itself.

According to the AGC circuit of FIG. 8, the gain control voltage V8 to be fed back to the variable gain amplifier circuit 1 is not generated by switching between the signals V7 and V13, but is generated based on only the output voltage V7 of the first D/A converter circuit 9 corresponding to the count value of the first up/down counter 5. With this configuration, when the output signal V14 of the second voltage comparator 19 changes from a high level to a low level, for example, the down-count clock V6 for the first up/down counter 5 may be changed from a high frequency V6(1) to a low frequency V6(2) by the clock switch circuit 21. The clocks may be set so that frequency of V5>frequency of V11 and frequency of V6(1)>frequency of V12 (÷frequency of V6(2)). By this setting, an agreeable audio signal can be output as in the AGC circuit of FIG. 6.

Figure 9:
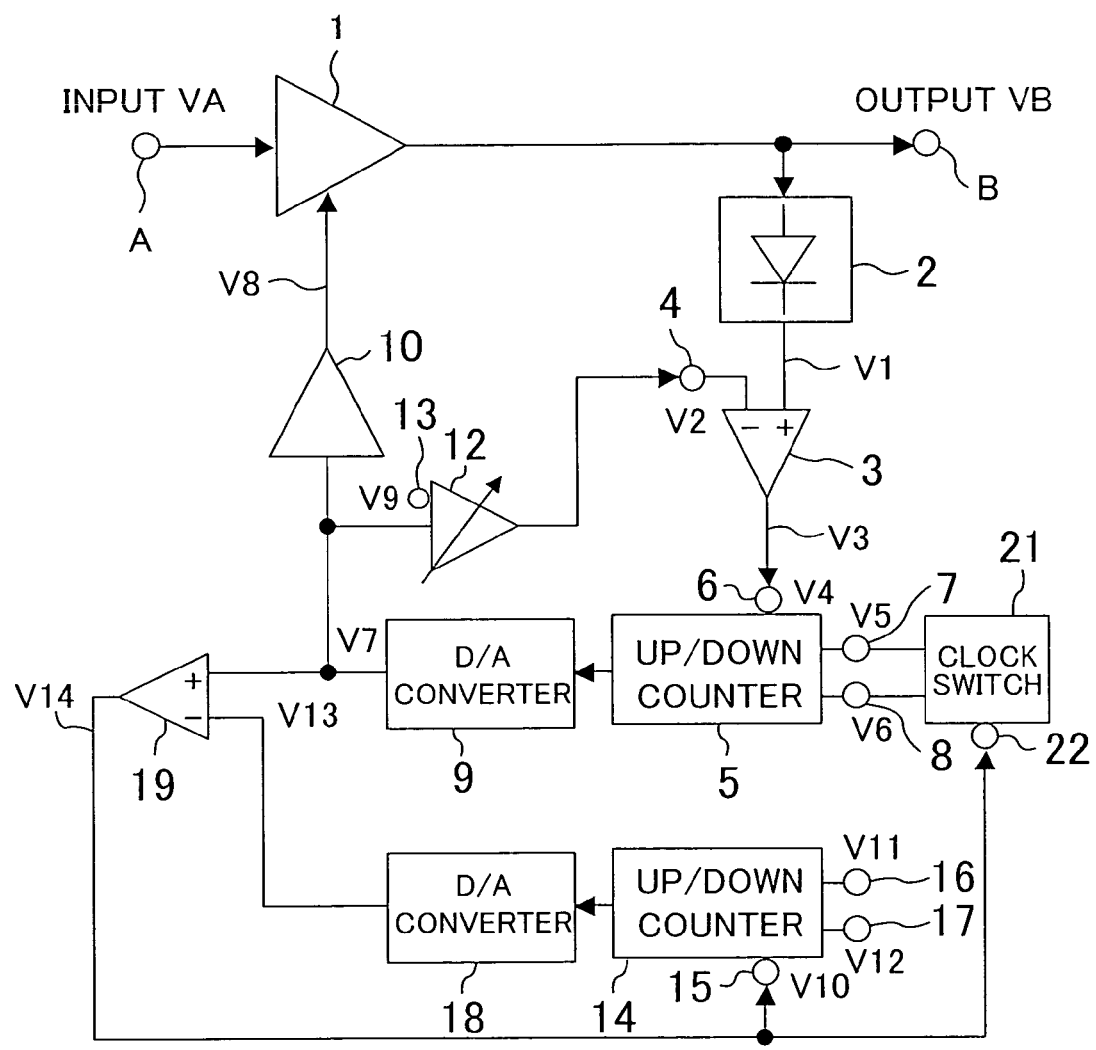
FIG. 9 is a block diagram of an alteration to the AGC circuit of FIG. 8.

FIG. 9 shows an alteration to the AGC circuit of FIG. 8. As in the alteration of FIG. 4 to the configuration of FIG. 1, the second DC amplifier circuit 11 in FIG. 8 is replaced with the variable gain amplifier circuit 12.

Figure 10:
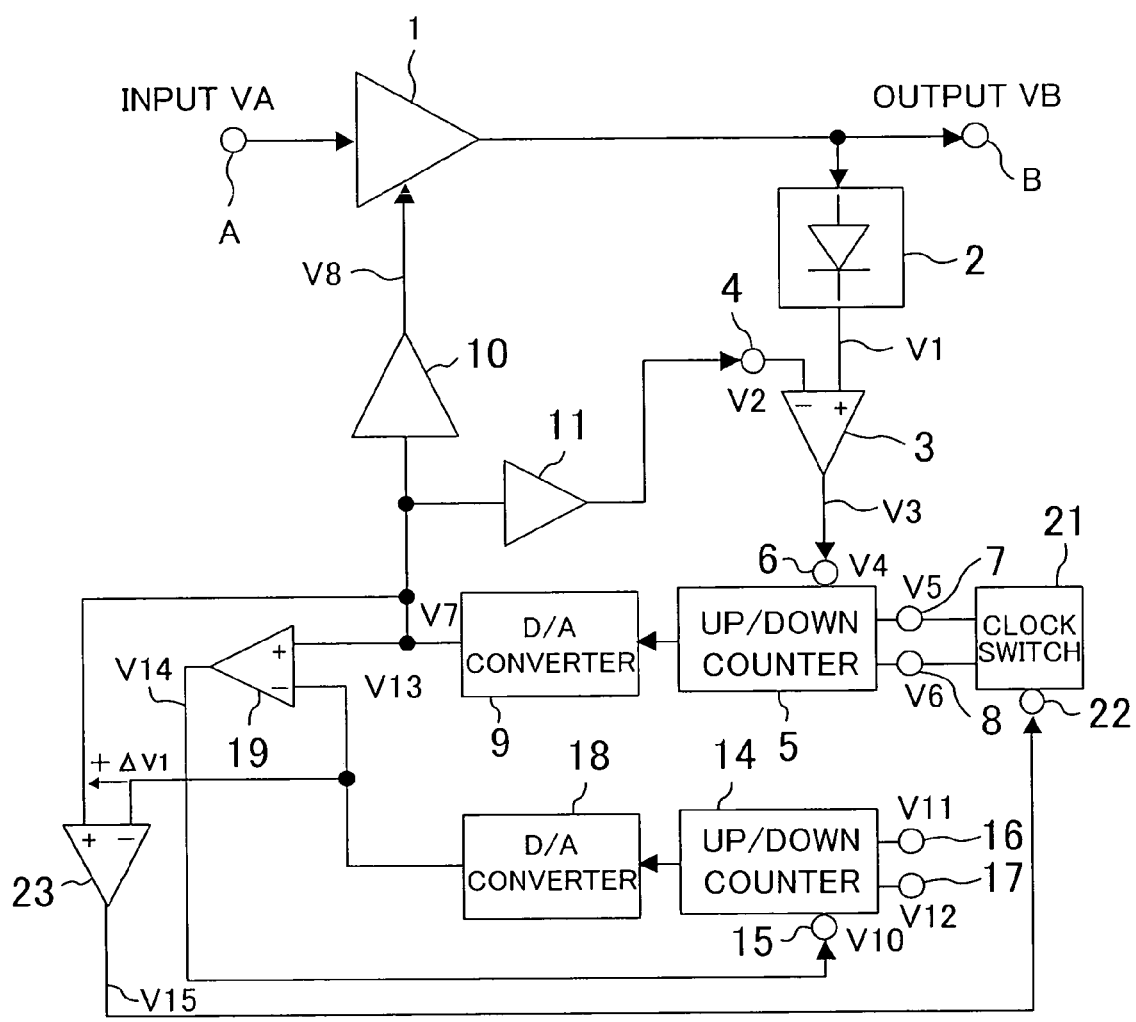
FIG. 10 is a block diagram of an AGC circuit of Embodiment 4 of the present invention.

FIG. 10 shows a configuration of an AGC circuit of Embodiment 4 of the present invention. In FIG. 10, the same components as those of the AGC circuit of FIG. 8 are denoted by the same reference numerals, and description thereof is omitted here. Only the component newly added to the AGC circuit of FIG. 8 will be described hereinafter. The AGC circuit of this embodiment includes a third voltage comparator 23 for comparing the output voltage V7 of the first D/A converter circuit 9 with the output voltage V13 of the second D/A converter circuit 18. The third voltage comparator 23 outputs a voltage V15 of a high level or a low level depending on the result of the comparison between the voltages V7 and V13, to control the operation of the clock switch circuit 21. The third voltage comparator 23 is intentionally provided with an offset of $\Delta V1$ to have a threshold giving $V7=V13+\Delta V1$ at which the polarity of the output voltage V15 is inverted. Specifically, the third voltage comparator 23 outputs the voltage V15 of a high level if $V7>V13+\Delta V1$, and outputs that of a low level if $V7<V13+\Delta V1$.

The operation of the AGC circuit of this embodiment is the same as that described with reference to FIG. 8, except that the clock switch circuit 21 for switching the frequency of a count clock for the first up/down counter 5 is controlled with the output voltage V15 of the third voltage comparator 23.

The AGC circuit of FIG. 8 described above can eliminate the temporal adverse effect on audibility that may occur for a change in the input signal VA, but will have an adverse effect on audibility when the signal is stable at a constant amplitude level. This phenomenon will be described as follows.

In the configuration of FIG. 8, the attenuation by the up-counting and the amplification by the down-counting are balanced with each other, so that the output signal VB is converged to a constant amplitude level. During the period in which the output signal VB is stable at a constant amplitude level, the count value of the first up/down counter 5 is counted up by up-counting by the amount counted down by down-counting, to balance the up-counting and the down-counting with each other. When the frequencies of the count clocks are set as described above, the down-count clock V6 for the first up/down counter 5 switches between V6(1) and V6(2) according to the output signal V14 of the second voltage comparator 19 via the clock switch circuit 21, and this causes distortion in the waveform of the output signal VB. The reason is that since the count clocks V5 and V6(1) high in frequency are involved in the balanced state, the magnitude of change of the count value is large. In use for audio signal processing, for example, a large magnitude of change of the count value will result in, not only distortion in output waveform, but also generation of sound different from input one in a steeply changing portion. If the frequencies of V5 and V6(1) are reduced to avoid the above problem, the temporal adverse effect on audibility will occur for a change in the input signal VA. It is therefore inappropriate to reduce the frequencies of V5 and V6(1).

Using the AGC circuit of FIG. 10 can solve the above phenomenon using the same setting of the count clock frequencies. To state specifically, the down-count clock V6 for the first up/down counter 5 switches between V6(1) and V6(2) according to the output signal V15 of the third voltage comparator 23 via the clock switch circuit 21. This reduces the magnitude of change of the count value of the first up/down counter 5, and thus reduces the magnitude of change of the output voltage V7 of the first D/A converter circuit 9. As a result, distortion in the waveform of the output signal VB can be reduced.

Figure 11:
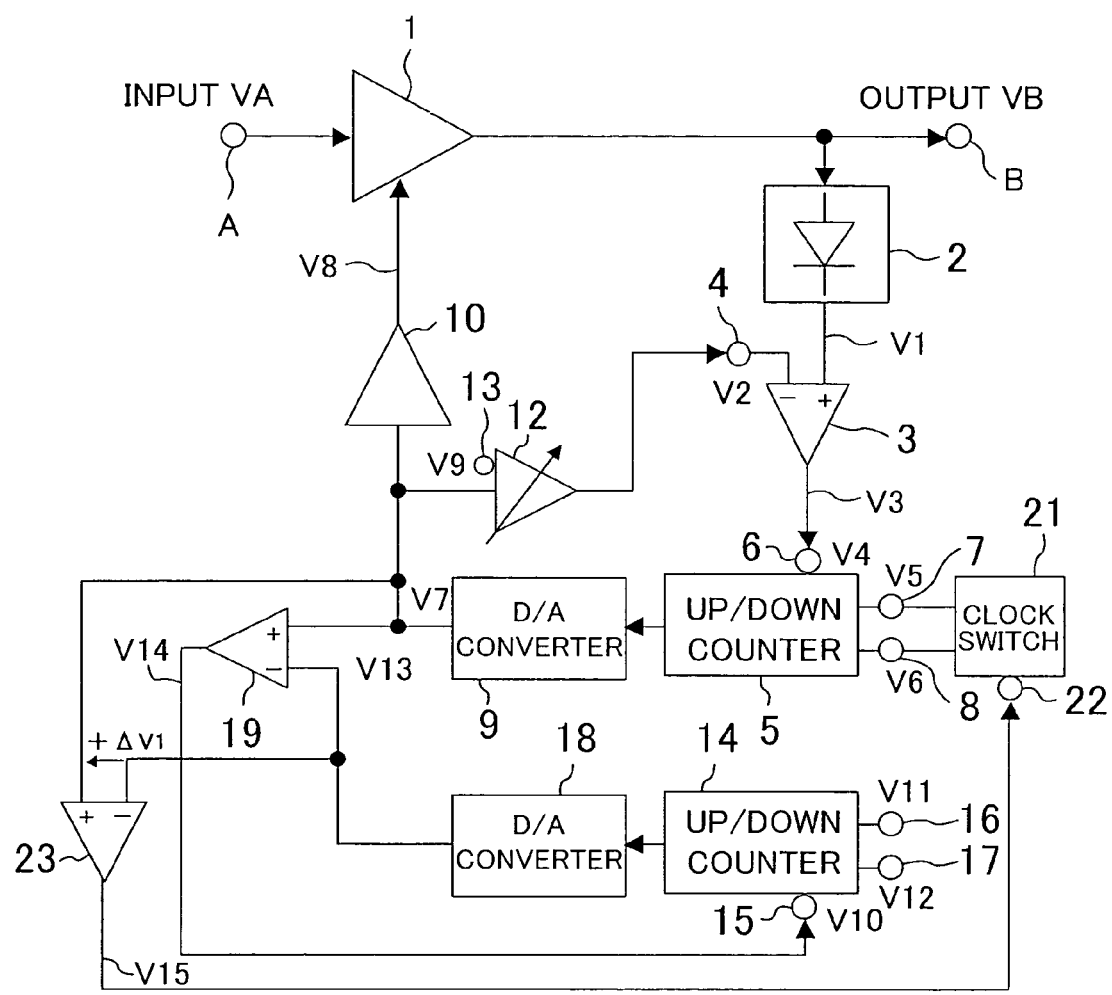
FIG. 11 is a block diagram of an alteration to the AGC circuit of FIG. 10.

FIG. 11 shows an alteration to the AGC circuit of FIG. 10. As in the alteration of FIG. 4 to the configuration of FIG. 1, the second DC amplifier circuit 11 in FIG. 10 is replaced with the variable gain amplifier circuit 12.

Figure 12:
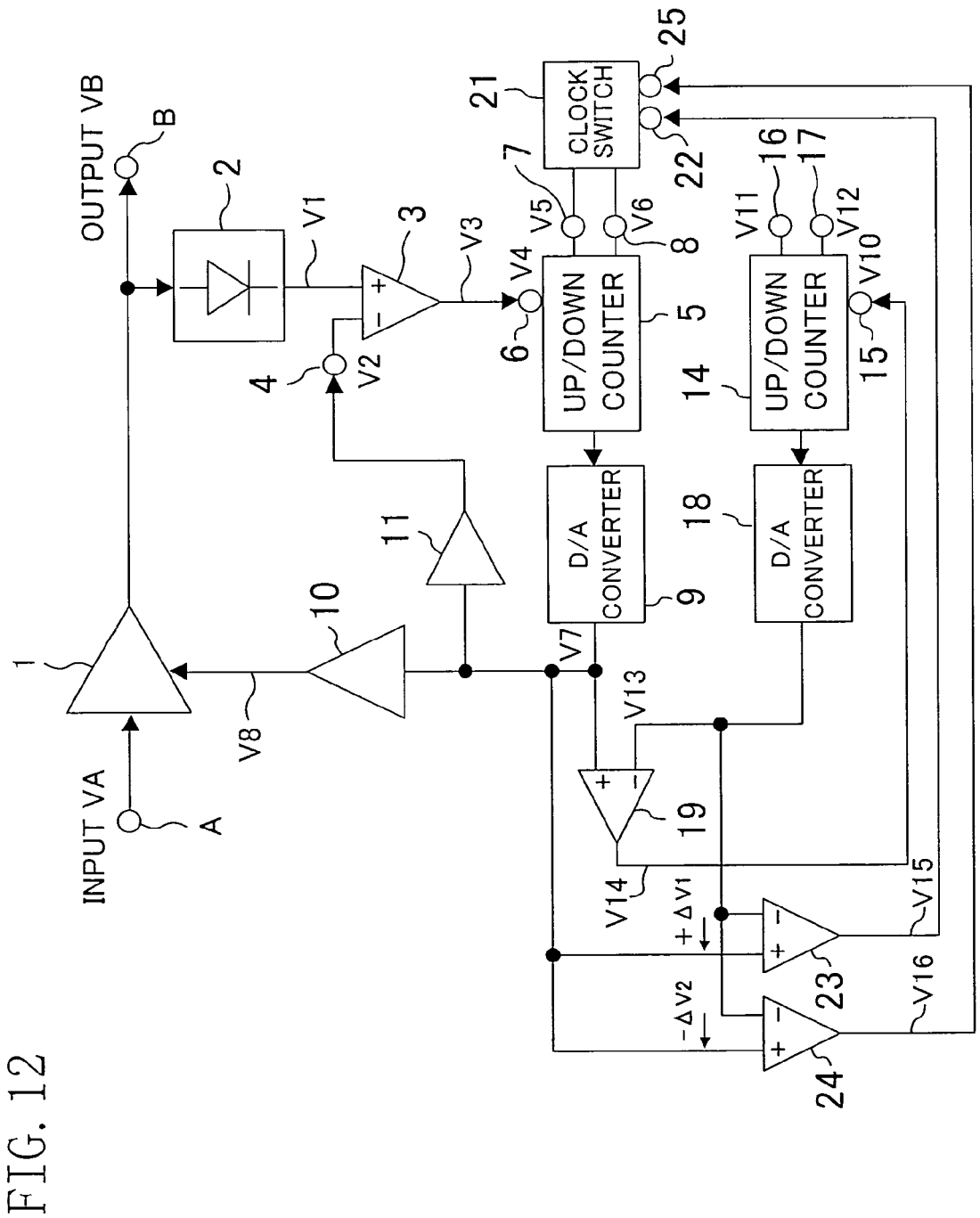
FIG. 12 is a block diagram of an AGC circuit of Embodiment 5 of the present invention.

FIG. 12 shows a configuration of an AGC circuit of Embodiment 5 of the present invention. In FIG. 12, the same components as those of the AGC circuit of FIG. 10 are denoted by the same reference numerals, and description thereof is omitted here. Only the component newly added to the AGC circuit of FIG. 10 will be described hereinafter. The AGC circuit of this embodiment includes a fourth voltage comparator 24 for comparing the output voltage V7 of the first D/A converter circuit 9 with the output voltage V13 of the second D/A converter circuit 18. The fourth voltage comparator 24 outputs a voltage V16 of a high level or a low level depending on the result of the comparison between the voltages V7 and V13. The clock switch circuit 21 has a second clock switch control input terminal 25 for receiving the output voltage V16 of the fourth voltage comparator 24, in addition to the (first) clock switch control input terminal 22 for receiving the output voltage V15 of the third voltage comparator 23. These voltages V15 and V16 serve to control the operation of the clock switch circuit 21. The fourth voltage comparator 24 is intentionally provided with an offset of $-\Delta V2$ to have a threshold giving $V7=V13-\Delta V2$ at which the polarity of the output voltage V16 is inverted. Specifically, the fourth voltage comparator 24 outputs the voltage V16 of a high level if V7>V13−ΔV2, and outputs that of a low level if V7<V13−ΔV2.

The operation of the AGC circuit of this embodiment is the same as that described with reference to FIG. 10, except that the clock switch circuit 21 for switching the frequency of a count clock for the first up/down counter 5 is controlled with the output voltage V15 of the third voltage comparator 23 and the output voltage V16 of the fourth voltage comparator 24.

In the AGC circuit of FIG. 10 described above, distortion will arise in the waveform of the output signal that has been stable at a constant amplitude level in any of the following events: 1) when the time section of up-counting, which normally appears twice for each period of the input signal VA, appears only once for each period due to an offset of the variable gain amplifier circuit 1; 2) when the rectifier circuit 2 is a half-wave rectifier circuit; and 3) when the input signal VA becomes low in frequency. A point common to all of these events is that the time section of down-counting becomes long. This will be discussed below.

In the configuration of FIG. 10, assume that the time section of up-counting appears only once for each period of the input signal VA due to an offset of the variable gain amplifier circuit 1. As described earlier, the output signal VB is converged to a constant amplitude level by balancing the attenuation by the up-counting with the amplification by the down-counting. If the time section of down-counting becomes long, the count-down amount of the count value by the down-counting increases, and as a result, the count-up amount of the count value by the up-counting also increases. The output voltage V7 of the first D/A converter circuit 9 becomes the gain control voltage V8 for the variable gain amplifier 1 via the first DC amplifier circuit 10, to amplify or attenuate the input signal VA. Since the magnitude of change of the output voltage V7 of the first D/A converter circuit 9 is large in this case, the resultant output signal VB will have distortion in waveform. Likewise, in the second and third events described above, in which the time section of down-counting is also long, a distorted waveform will be output. If the frequency of the up-count clock V5 is lowered to avoid this problem, the attack time will become long, worsening the response property for a change in the input signal VA. If the frequency of the lower down-count click V6(2) is lowered, the recovery time will become long, and if it is lowered too much, it will take a long time for the input signal VA to resume its constant amplitude after the input signal VA is made small. In the case of sound, the adverse effect on audibility that sound is not heard or difficult to be heard for a longer time will occur.

To overcome the above phenomenon, the down-count clock V6 may be changed to a further low frequency V6(3) only when the output signal VB is stable at a constant amplitude, for example. By use of the AGC circuit of FIG. 12, the above phenomenon can be overcome without the necessity of changing the response property.

In the AGC circuit of FIG. 12, the clock switch circuit 21 switches the frequency of the down-count clock V6 for the first up/down counter 5 among V6(1), V6(2) and V6(3) according to the polarities of the output voltages V15 and V16 of the third and fourth voltage comparators 23 and 24. The frequencies have the relationship that frequency of V6(1) >frequency of V6(2)>frequency of V6(3). Specifically, the clock switch circuit 21 selects the frequency of V6(1) if V7>V13+ΔV1, the frequency of V6(2) if V7<V13−ΔV2 and the frequency of V6(3) if V13−ΔV2<V7<V13+ΔV1. As a result, in the state that the up-counting and the down-counting are balanced with each other, the down-counting, determined with the output voltage V7 of the first D/A converter circuit 9, follows the frequency of the lowest down-count clock V6(3). This reduces the magnitude of change due to the down-counting, and thus reduces the magnitude of change due to the up-counting. In this way, distortion in the waveform of the output signal VB is improved.

Figure 13:
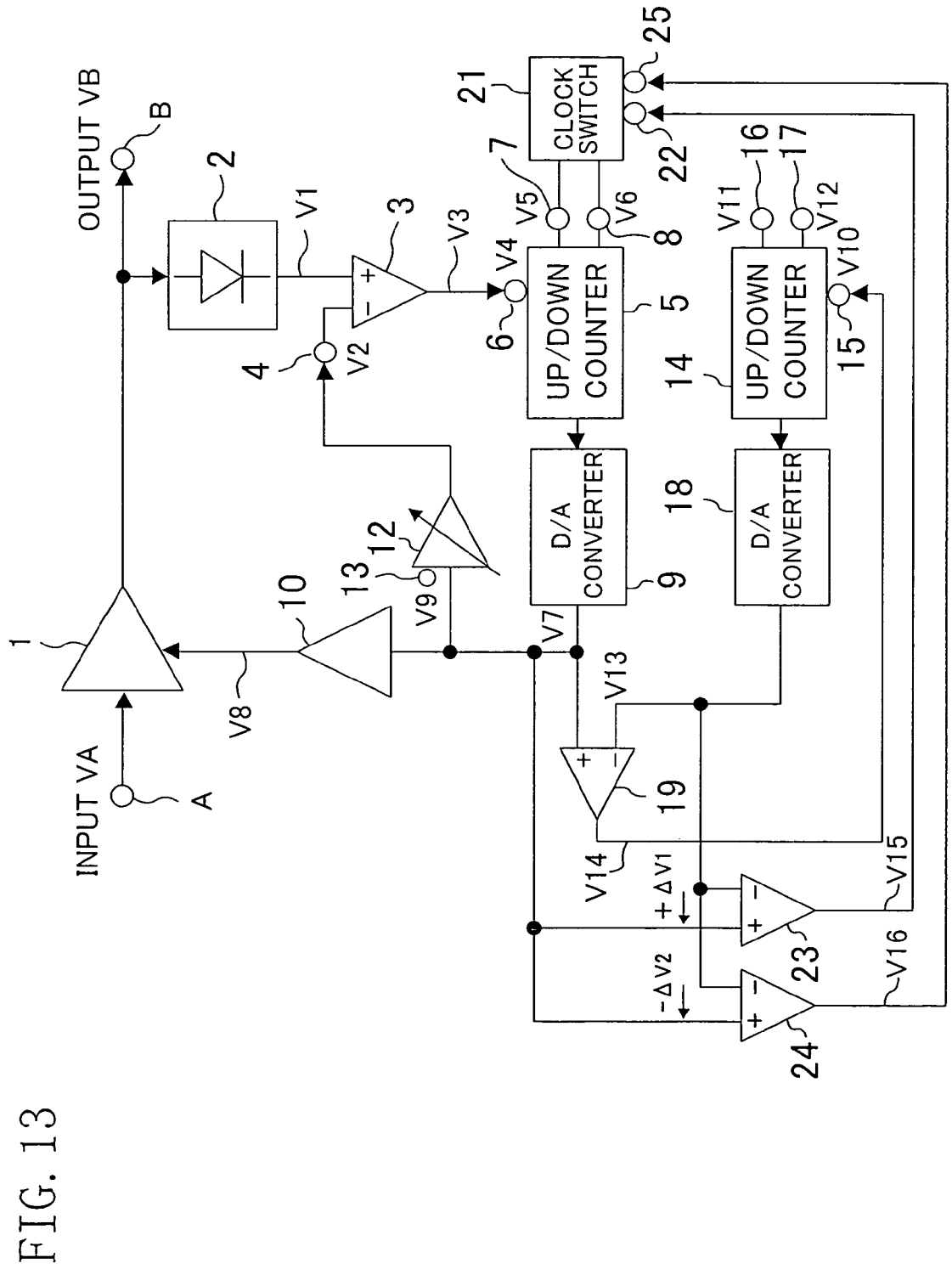
FIG. 13 is a block diagram of an alteration to the AGC circuit of FIG. 12.

FIG. 13 shows an alteration to the AGC circuit of FIG. 12. As in the alteration of FIG. 4 to the configuration of FIG. 1, the second DC amplifier circuit 11 in FIG. 12 is replaced with the variable gain amplifier circuit 12.

While the specific embodiments of the present invention were described in detail, the present invention is not limited to these embodiments, but can be modified in various ways without departing from the technical scope of the present invention.

For example, although the voltage-based gain control was assumed for the variable gain amplifier 1 in the above embodiments, the output type of the first DC amplifier circuit 10 can be changed depending on the gain control method (current-based or voltage-based) of the variable gain amplifier circuit 1.

In the above embodiments, the output voltage V7 of the first D/A converter circuit 9 was input into the first DC amplifier circuit 10, and the output voltage of the first DC amplifier circuit 10 was used as the gain control voltage V8. Alternatively, the output voltage V7 of the first D/A converter circuit 9 may be directly used as the gain control signal. Likewise, the output voltage V7 of the first D/A converter circuit 9 was input into the second DC amplifier circuit 11, and the output voltage of the second DC amplifier circuit 11 was used as the threshold voltage V2 for the voltage comparator 3. Alternatively, the output voltage V7 of the first D/A converter circuit 9 may be directly used as the threshold voltage V2.

In Embodiments 2 to 5, the output voltage V7 of the first D/A converter circuit 9 was used as the input of the second DC amplifier circuit 11 or the second variable gain amplifier circuit 12. Substantially the same effect can also be obtained by using the output voltage V13 of the second D/A converter circuit 18 as the input of the second DC amplifier circuit 11 or the second variable gain amplifier circuit 12 since, like the output voltage V7 of the first D/A converter circuit 9, the output voltage V13 of the second D/A converter circuit 18 also changes with the amplitude level of the input signal VA.

In the above embodiments, a flipflop for relieving influence of chattering and external noise may be added. Such a flipflop can be inserted at an appropriate position such as a position between the first voltage comparator 3 and the up/down counting control input terminal 6 of the first up/down counter 5, a position between the second voltage comparator 19 and the switch circuit 20, a position between the second voltage comparator 19 and the second up/down counter 14, a position between the third voltage comparator 23 and the clock switch circuit 21, and a position between the fourth voltage comparator 24 and the clock switch circuit 21.

A counting control circuit may be provided in the first and second up/down counters 5 and 14 to prevent count overflowing. Otherwise, an overflow prevention function may be incorporated in the first and second up/down counter 5 and 14.

As described above, according to the present invention, the amplitude level of the output signal can be changed with the amplitude level of the input signal. Accordingly, the AGC circuit of the present invention is useful as an AGC circuit for an audio system required to output an audio signal having depth and perspective in audibility.

What is claimed is:

1. An AGC circuit comprising:
   a variable gain amplifier circuit having a gain controlled with a gain control signal;

a rectifier circuit for rectifying an output signal of the variable gain amplifier circuit;

a voltage comparator for comparing a rectified signal from the rectifier circuit with a threshold voltage;

an up/down counter that switches between up-counting and down-counting according to an output voltage of the voltage comparator; and a D/A converter circuit for outputting a voltage corresponding to a count value of the up/down counter, wherein the count value is produced in accordance with first and second clock signals, provided respectively to first and second input terminals of the up/down counter, such that:

when the up-counting is performed the up/down counter increments the count value in accordance with the first clock signal and when the down-counting is performed the up/down counter decrements the count value in accordance with the second clock signal, and the gain control signal and the threshold voltage correspond to the voltage output from the D/A converter circuit.

2. An AGC circuit comprising:

a variable gain amplifier circuit having a gain controlled with a gain control signal;

a rectifier circuit for rectifying an output signal of the variable gain amplifier circuit;

a first voltage comparator for comparing a rectified signal from the rectifier circuit with a threshold voltage;

a first up/down counter that switches between up-counting and down-counting according to an output voltage of the first voltage comparator;

a first D/A converter circuit for outputting a voltage corresponding to a count value of the first up/down counter;

a second up/down counter that switches between up-counting and down-counting according to a given voltage level;

a second D/A converter circuit for outputting a voltage corresponding to a count value of the second up/down counter;

second and third voltage comparators each for comparing the output voltage of the first D/A converter circuit with the output voltage of the second D/A converter circuit; and a clock switch circuit for switching a frequency of a count clock for the first up/down counter based on an output voltage of the third voltage comparator, wherein the second up/down counter is configured to switch between the up-counting and the down-counting according to an output voltage of the second voltage comparator, and the gain control signal supplied to the variable gain amplifier circuit corresponds to the voltage output from the first D/A converter circuit, and the threshold voltage for the first voltage comparator corresponds to the voltage output from the first or second D/A converter circuit.

3. An AGC circuit comprising:

a variable gain amplifier circuit having a gain controlled with a gain control signal;

a rectifier circuit for rectifying an output signal of the variable gain amplifier circuit;

a first voltage comparator for comparing a rectified signal from the rectifier circuit with a threshold voltage;

a first up/down counter that switches between up-counting and down-counting according to an output voltage of the first voltage comparator;

a first D/A converter circuit for outputting a voltage corresponding to a count value of the first up/down counter;

a second up/down counter that switches between up-counting and down-counting according to a given voltage level;

a second D/A converter circuit for outputting a voltage corresponding to a count value of the second up/down counter;

second, third and fourth voltage comparators each for comparing the output voltage of the first D/A converter circuit with the output voltage of the second D/A converter circuit; and a clock switch circuit for switching a frequency of a count clock for the first up/down counter based on output voltages of the third and fourth voltage comparators, wherein the second up/down counter is configured to switch between the up-counting and the down-counting according to an output voltage of the second voltage comparator, and the gain control signal supplied to the variable gain amplifier circuit corresponds to the voltage output from the first D/A converter circuit, and the threshold voltage for the first voltage comparator corresponds to the voltage output from the first or second D/A converter circuit.

* * * * *